United States Patent
Shinoda et al.

(10) Patent No.: US 7,130,024 B2
(45) Date of Patent: Oct. 31, 2006

(54) EXPOSURE APPARATUS

(75) Inventors: Kenichiro Shinoda, Tochigi (JP); Kenichiro Mori, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 131 days.

(21) Appl. No.: 10/851,851

(22) Filed: May 21, 2004

(65) Prior Publication Data

US 2005/0024619 A1    Feb. 3, 2005

(30) Foreign Application Priority Data

May 22, 2003  (JP)  ............................. 2003-144976
Mar. 2, 2004  (JP)  ............................. 2004-058107

(51) Int. Cl.
*G03B 27/32* (2006.01)
*G03B 27/54* (2006.01)
*G03B 27/72* (2006.01)

(52) U.S. Cl. ....................................... 355/71
(58) Field of Classification Search ............ 355/67, 355/71, 77
See application file for complete search history.

(56) References Cited

U.S. PATENT DOCUMENTS 4,589,769 A * 5/1986 Matsuki ................ 355/71
4,937,618 A * 6/1990 Ayata et al. ................ 355/43
2002/0109827 A1* 8/2002 Nishi .................... 355/53

FOREIGN PATENT DOCUMENTS

| JP | 60-45252 | 3/1985 |
|----|----------|--------|
| JP | 60-158449 | 8/1985 |
| JP | 7-37774 | 2/1995 |
| JP | 2000-114164 | 4/2000 |

* cited by examiner

*Primary Examiner*—Rodney Fuller
(74) *Attorney, Agent, or Firm*—Morgan & Finnegan, L.L.P.

(57) ABSTRACT

An exposure apparatus includes an illumination optical system for illuminating an reticle using light from a light source, a projection optical system for projecting a pattern of the reticle onto a substrate, and a variable stop having an opening for regulating an illumination area on the substrate, said variable stop is arranged near a position conjugate with the substrate, wherein a position of the variable stop is variable along an optical axis of the illumination optical system or an optical axis of the projection optical system.

15 Claims, 16 Drawing Sheets

STEP 1

CALCULATE, DECIDE AND STORE THE DEFOCUS LENGTH OF THE VARIABLE STOP 128a ACCORDING TO THE NUMERICAL APERTURE NA OF THE ILLUMINATION OPTICAL SYSTEM 120 IN A PLURALITY OF THE ILLUMINATION MODE

STEP 2

DETECT THE ILLUMINATION DISTRIBUTION OF THE EXPOSURE SURFACE IN EACH ILLUMINATION MODE BY LIGHT SENSOR 452, AND CALCULATE, DECIDE AND STORE THE SHAPE OF THE OPENINIG 128c OF THE VARIABLE STOP 128a FOR SPECIFIC DISTRIBUTION IN SCANNING EXPOSURE

STEP 3

SELECT AND DECIDE THE ILLUMINATION MODE TO BE USED, DECIDE THE EXPOSURE, DECIDE SCANNING SPEED AND OUTPUT OF THE LIGHT SOURCE

STEP 4

ADJUST DEFOCUS LENGTH OF THE VARIABLE STOP 128a AND SHAPE OF THE OPNING 128c ACCORDING TO THE SELECTED ILLUMINATION MODE.

STEP 5

INSTALL THE RETICLE 200 ON THE RETICLE STAGE 250

STEP 6

START EXPOSING

FIG. 8

STEP 11

MEASURE THE ILLUMINATION DISTRIBUTION
IN THE Y-DIRECTION
(TRAPEZOID DISTRIBUTION)
IN A PLURALITY OF THE ILLUMINATION MODE
WHILE STOPPING,
AND CALCULATE, DECIDE AND STORE
THE DEFOCUS LENGTH OF THE VARIABLE STOP
FOR TRAPEZOID DISTRIBUTION TO BE SPECIFIC

STEP 12

DETECT THE ILLUMINATION DISTRIBUTION
OF THE EXPOSURE SURFACE IN
EACH ILLUMINATION MODE
BY LIGHT SENSOR 452, AND
CALCULATE, DECIDE AND STORE
THE SHAPE OF THE OPENINIG 128c
OF THE VARIABLE STOP 128a
FOR SPECIFIC DISTRIBUTION
IN SCANNING EXPOSURE

STEP 13

SELECT AND DECIDE
THE ILLUMINATION
MODE TO BE USED,
DECIDE THE EXPOSURE,
DECIDE SCANNING SPEED AND
OUTPUT OF THE LIGHT SOURCE

STEP 14

ADJUST DEFOCUS LENGTH OF THE VARIABLE STOP 128a
AND SHAPE OF THE OPNING 128c
ACCORDING TO THE SELECTED ILLUMINATION MODE

STEP 15

INSTALL THE RETICLE 200
ON THE RETICLE STAGE 250

STEP 16

START EXPOSING

FIG. 9

(STEP 1)
MEASURE DEFORCUS DISTORTION IN A PLURALITY OF THE ILLUMINATION MODE, DECIDE AND STORE THE OPTIMUM DEFOCUS DIFFERENCE OF VARIABLE STOP ACCORDING TO THE MEASURED VALUE (STEP 2)
SELECT AND DECIDE THE ILLUMINATION MODE TO BE USED, DECIDE THE EXPOSURE, DECIDE SCANNING SPEED AND OUTPUT OF THE LIGHT SOURCE (STEP 3)
ADJUST THE DEFORCUS DIFFERENCE OF VARIABLE STOP IN ACCORDANCE WITH THE DATA STORED IN STEP 1 ACCORDING TO THE SELECTED ILLUMINATION MODE (STEP 4)
INSTALL THE RETICLE ON THE RETICLE STAGE (STEP 5)
START EXPOSING

FIG. 18

EXPOSURE APPARATUS

This application claims priority benefit under 35 U.S.C. § 119 based on Japanese Patent Application No.2003-144976 filed on May 22, 2003 and Japanese Patent Application No. 2004-058107 filed on Mar. 2, 2004, which are hereby incorporated by reference herein in their entirety as if fully set forth herein.

BACKGROUND OF THE INVENTION

The present invention relates generally to an exposure apparatus which exposes a substrate, and more particularly to an exposure apparatus for fabricating devices such as semiconductor devices like ICs or LSIs, imaging devices like CCDs, display devices like liquid crystal panels, and detecting devices like magnetic heads, for example, by exposing a circuit pattern on a reticle onto a wafer.

A projection exposure apparatus has been conventionally used for an apparatus to fabricate devices using photolithography, where the exposure apparatus projects, exposes, and transfers a circuit pattern of a reticle (mask) as an original form to a wafer or glass plate as a substrate by using a projection optical system.

The projection optical apparatus exposes the wafer for example, by using a step-and-repeat method or step-and-scan method. The step-and-repeat type projection exposure apparatus is called a stepper and exposes one whole shot simultaneously onto the wafer, then moves the wafer stepwise every one shot so that the next shot comes to an area to be exposed. The step-and-scan type projection exposure apparatus called a scanner exposes the circuit pattern of the reticle onto the wafer by scanning the wafer continuously onto the reticle, and moves the wafer stepwise every one shot so that the next shot comes to the area to be exposed.

FIG. 13 is a schematic block diagram of a conventional step-and-scan type exposure apparatus 1000. The exposure apparatus 1000 has a plurality of illumination modes such as a small σ mode in small σ illumination condition, a large σ mode in large σ illumination condition, and an annular mode in an annular illumination condition.

The exposure apparatus 1000 calibrates, in advance, the output of the sensor 1500 which detects the illumination in each illumination mode of the wafer 1400 and the output of the integrated exposure sensor 1210 provided in the illumination optical system 1200, and stores the calibration results. More, the exposure apparatus detects the illumination distribution of the exposure area in each illumination mode by moving the sensor 1500 in two dimensions, adjusts and stores the opening shape of a variable stop 1280a so that the illumination distribution is a specific (generally, an even distribution) in scanning exposure (see Japanese Patent Publication applications No. 7-037774, and No. 2000-114164).

In a scanning exposure, a running field stop 1280b arranged near the variable stop 1280a regulates the illumination area of the reticle 1600 and the illumination area of the wafer 1400 optically conjugate with the reticle 1600, and is movable to an arrow P direction in synchronization with the reticle 1600 and the wafer 1400.

In the case that a specific illumination mode is designated and the exposure in the specific illumination mode is decided, a scanning speed V [mm/s] of a wafer stage 1450, an opening width W [mm] of the variable stop in scanning direction, and a laser emission frequency F [Hz] are decided to satisfy the equation "V=F*W/n". Here, n is an exposure pulse count that is a laser pulse count emitted to a specific spot on the exposure surface in scanning exposure. The minimum value of the pulse count n is decided by the sensitivity of the reticle 1600, a pulse energy, and the like. Additionally, the exposure needs the minimum value of the pulse count or more.

The variable stop 1280a is arranged so as to moderately defocus (be distanced from) the running field stop 1280b (arranged at a position conjugate with the surface of the wafer 1400) to form the illumination distribution on the wafer 1400 in scanning desirably. Therefore, the integrated illumination (the illumination distribution of the shot area after scanning) is highly uniformed by scanning with forming the illumination distribution to be approximately trapezoid on the wafer 1400 surface in scanning direction while the stage stops (see Japanese Patent Publication application No. 60-158449).

It is proposed that the exposure apparatus moves the stop along the optical axis to be conjugate with the reticle when the thickness of the reticle has changed (see Japanese Patent Publication application No. 60-45252).

Along with recent demands for an exposure apparatus with higher resolution, shorter wavelengths of light sources have been promoted from i-line to KrF excimer lasers and ArF excimer lasers. The wavelengths of the light sources are thought to likely be shorter, such as F2 laser, in the future. Also, the numerical aperture (NA) of the exposure apparatus will be larger: from 0.70 to 0.80 or 0.85.

As previously explained, the variable stop is arranged so as to moderately defocus (be distanced from) the running field stop (arranged at a position conjugate with the surface of the wafer), so that the illumination distribution on the wafer surface is formed to be approximately trapezoid. Here, to form the trapezoid distribution (defocus level) appropriately, the distance between the variable stop 1280a and the running field stop 1280b should become shorter in accordance with the larger NA of the illumination light. However, the conventional exposure apparatus cannot bring the variable stop 1280a sufficiently close to the running field stop 1280b, because their distance has a mechanical limitation.

Therefore, if the NA of the illumination light is large, the trapezoidal illumination distribution on the wafer surface will be defocused more than necessary, the range of the trapezoid distribution will be forced out from the illumination area, the illumination efficiency will become low, and the productivity in the device fabrication will become low. More, as the scanning exposure uses the illumination light having the illumination distribution range that forces out from the illumination area, the uniformity of the integrated illumination (scanning illumination distribution) will deteriorate. Another problem is that defocus distortion is produced when the defocus level of the trapezoid distribution is different on one side of the scanning direction than on the other side of the scanning direction. Here, defocus distortion means an image shift in defocusing the image from the best focusing position of the projection optical system. The projection exposure apparatus needs a small defocus distortion. Because the section of the wafer comes to have a stepped shape as shown in FIG. 14 in accordance with laminating layers in a semiconductor fabrication process, the pattern-exposed position will shift in the upper stair and in the lower stair.

The slant of the light beam balanced in the center of the wafer surface of the projection exposure apparatus may cause the defocus distortion. As shown in FIG. 14, if the balance center CL of the light beam which forms an image at a spot P is inclined from a direction perpendicular to the wafer surface, the image-transferred position will shift when the defocus is produced. For example, a grid pitch of a grid pattern shown in FIG. 15A, which is projected on the step-shaped wafer shown in FIG. 14, is elongated at the stepped part of the wafer as shown in FIG. 15B. Thus, fidelity of the transferred image deteriorates and the circuit pattern cannot be transferred accurately. The exposure apparatus should have low defocus distortion as explained before, and should not generate the position shift of the image even if there is a step on the wafer surface caused by the lamination of the layers.

The defocus distortion corresponds to the slant of the centroid of the exposure light beam integrated while scanning the exposure in the scanning exposure apparatus.

Now a description will be given of the defocus distribution caused by the variable stop referred to in FIG. 13 and FIG. 16. The illumination optical system 1200 is designed, for example, so that the reticle 1600 is conjugate with the running field stop 1280b. Without using the variable stop 1280a, all lights from a secondary light source formed by an optical integrator 1250 are overlapped onto the running field stop 1280b by being condensed by a condensing lens 1260. Therefore, the illumination area on the running field stop 1280b is illuminated uniformly. The illumination area on the reticle that is arranged at the position optically conjugate with the running field stop 1280b is also illuminated uniformly.

With the entrance of variable stop 1280a, the light beam is eclipsed and the trapezoid shaped illumination distribution is formed as explained before. FIG. 16 clearly shows that a light beam is eclipsed by a light shielding element 1280a1 of the variable stop from the upper-left toward the lower-right among the incidental light into an area A (one oblique side of the trapezoid) of the variable stop's opening. Therefore, the centroid of the light amount at each spot in the area A directs from the lower-left toward the upper-right. Similarly, a light beam from the lower-left toward the upper-right among the incidental light into an area B (the other oblique side of the trapezoid) of the variable stop's opening is eclipsed by a light shielding element 1280a2 of the variable stop. Therefore, the centroid of the light amount at each spot in area B directs from the upper-left toward the lower-right.

The distance from the running field stop 1280b to the variable stop 1280a1 and that to the variable stop 1280a2 are different, and the width of area A and that of area B are different. In this case, the centroid of the integrated exposure light amount is tilted, and defocus distortion in the scanning exposure is generated.

The amount of defocus distortion can be calculated by using integral calculus if the exposure is continuous. L is the width of the variable stop's opening, $\Delta z1$ and $\Delta z2$ are the defocuses of the variable stop 1280a1 and 1280a2 respectively. From the running field stop 1280b, NA is the numerical aperture of the incidental light to the wafer on the wafer surface. $\beta$ is a magnification from the running field stop to the wafer. Tan $\theta$ is the tilt of the centroid of the integrated exposure light in the scanning exposure and is described as $NA^2\beta^2 (\Delta z1-\Delta z2)/(3L)$ in the approximation of tan $\theta$=sin $\theta$. For example, if NA is 0.8, $\beta$ is 0.5, $\Delta z1-\Delta z2$ is 1 mm, and L is 7 mm, then tan $\theta$ as the tilt of the centroid of light will be 0.007619. Defocusing 1 µm shifts the image to 7.6 nm. That means if the line width of the transferred pattern is 70 nm, the non-allowable image shift of 10% of the line width is produced.

BRIEF SUMMARY OF THE INVENTION

Accordingly, it is an exemplary object to provide an exposure apparatus that exposes with high accuracy by making the illumination distribution on the substrate be specific (for example, a uniform distribution) despite the numerical aperture of the optical system in the exposure apparatus being large.

It is another exemplary object to provide an exposure apparatus that exposes with high accuracy by making the illumination distribution on the substrate stably be specific (for example, a uniform distribution) despite an exposure condition such as the illumination mode changing.

It is still another exemplary object to provide an exposure apparatus that can reduce the defocus distortion.

It is still another exemplary object to provide an exposure apparatus that can transfer to the wafer with higher accuracy by producing the defocus distortion rarely despite an exposure condition such as the illumination mode changing.

In order to achieve the above object, an exposure apparatus according to one aspect of the present invention includes an illumination optical system for illuminating an reticle using light from a light source, a projection optical system for projecting a pattern of the reticle onto a substrate, and a variable stop having an opening for regulating an illumination area on the substrate, wherein the variable stop is arranged near a position conjugate with the substrate, wherein a position of the variable stop is variable along an optical axis of the illumination optical system or an optical axis of the projection optical system.

The variable stop may be arranged at a position closer to the light source than the position conjugate with the substrate. The variable stop may be arranged at a position closer to the substrate than the position conjugate with the substrate. The shape of the opening of the variable stop may vary. The position of the variable stop along the optical axis may be adjusted in accordance with a numerical aperture of the light illuminating the reticle. The variable stop may be adjusted so that a distance between the variable stop and the position conjugate with the substrate when the numerical aperture is the first value is longer than a distance between the variable stop and the position conjugate with the substrate when the numerical aperture is the second value that is larger than the first value. The position of the variable stop along the optical axis may be adjusted so that the light from the light source has a specific illumination distribution on the substrate. The substrate may be exposed with scanning using the light from the light source, and the position of the variable stop along the optical axis may be decided so that an illumination distribution of the illumination area along a scanning direction is specific. An adjustment value corresponding to an exposure condition that is selected from a plurality of exposure conditions may be decided in accordance with data which indicate the adjustment value for the position of the variable stop along the optical axis, the data corresponding to the numerical aperture of the light illuminating the reticle in the plurality of the exposure conditions, and the position of the variable stop along the optical axis is adjusted. The exposure apparatus may further include a field stop at the position substantially conjugate with the substrate. The projection optical system may form an intermediate image of the pattern at the position substantially conjugate with the substrate, and the variable stop may be arranged near a position where the intermediate image is formed at a closer side to the light source.

According to another aspect of the present invention, an exposure apparatus includes an illumination optical system for illuminating an reticle using light from a light source, a projection optical system for projecting a pattern of the reticle onto a substrate, and a variable stop having an opening for regulating an illumination area on the substrate. The variable stop is arranged near a position conjugate with the substrate, wherein the variable stop has the first light shielding element and the second light shielding element, wherein a relative position between the first light shielding element and the second light shielding element is variable along an optical axis of the illumination optical system or an optical axis of the projection optical system.

An illumination optical system for illuminating an irradiated surface using light from a light source according to still another aspect of the present invention includes a variable stop having an opening for regulating an illumination area on the irradiated surface, wherein the variable stop is arranged near a position conjugate with the irradiated surface, wherein a position of the variable stop is variable along an optical axis of the illumination optical system.

An illumination optical system for illuminating an irradiated surface using light from a light source according to still another aspect of the present invention includes a variable stop having an opening for regulating an illumination area on the irradiated surface, wherein the variable stop is arranged near a position conjugate with the irradiated surface, wherein the variable stop includes a first light shielding element and a second light shielding element, and a relative position of the first light shielding element and the second light shielding element is variable along an optical axis of the illumination optical system.

A device fabricating method according to still another aspect of the present invention includes the steps of exposing a substrate by using the exposure apparatus explained before, and developing the substrate that has been exposed.

Other objects and further features of the present invention will become readily apparent from the following description of the preferred embodiments with reference to the accompanying drawings.

BRIEF DESCRIPTION OF THE DRAWINGS

FIG. 5 shows aperture shapes of the variable stop corresponding to the illumination modes.

FIG. 6 shows distribution shapes of the illumination light formed by the variable stop and the running field stop in the Y-direction.

FIG. 8 is a flowchart for explaining a method for improving the uniformity of illumination on a plate surface in scanning exposure by the exposure apparatus shown in FIG. 1.

FIG. 9 is a flowchart for explaining a method for improving uniformity of illumination on a plate surface in scanning exposure by an exposure apparatus of a variation according to the present invention.

FIG. 18 is a flowchart for explaining a method for minimizing the defocus distortion in scanning exposure by an exposure apparatus of the third embodiment.

DETAILED DESCRIPTION OF THE PREFERRED EMBODIMENTS

Referring now to the accompanying drawings, a description will now be given of an exposure apparatus of the embodiments according to the present invention.

[The First Embodiment]

Figure 1:
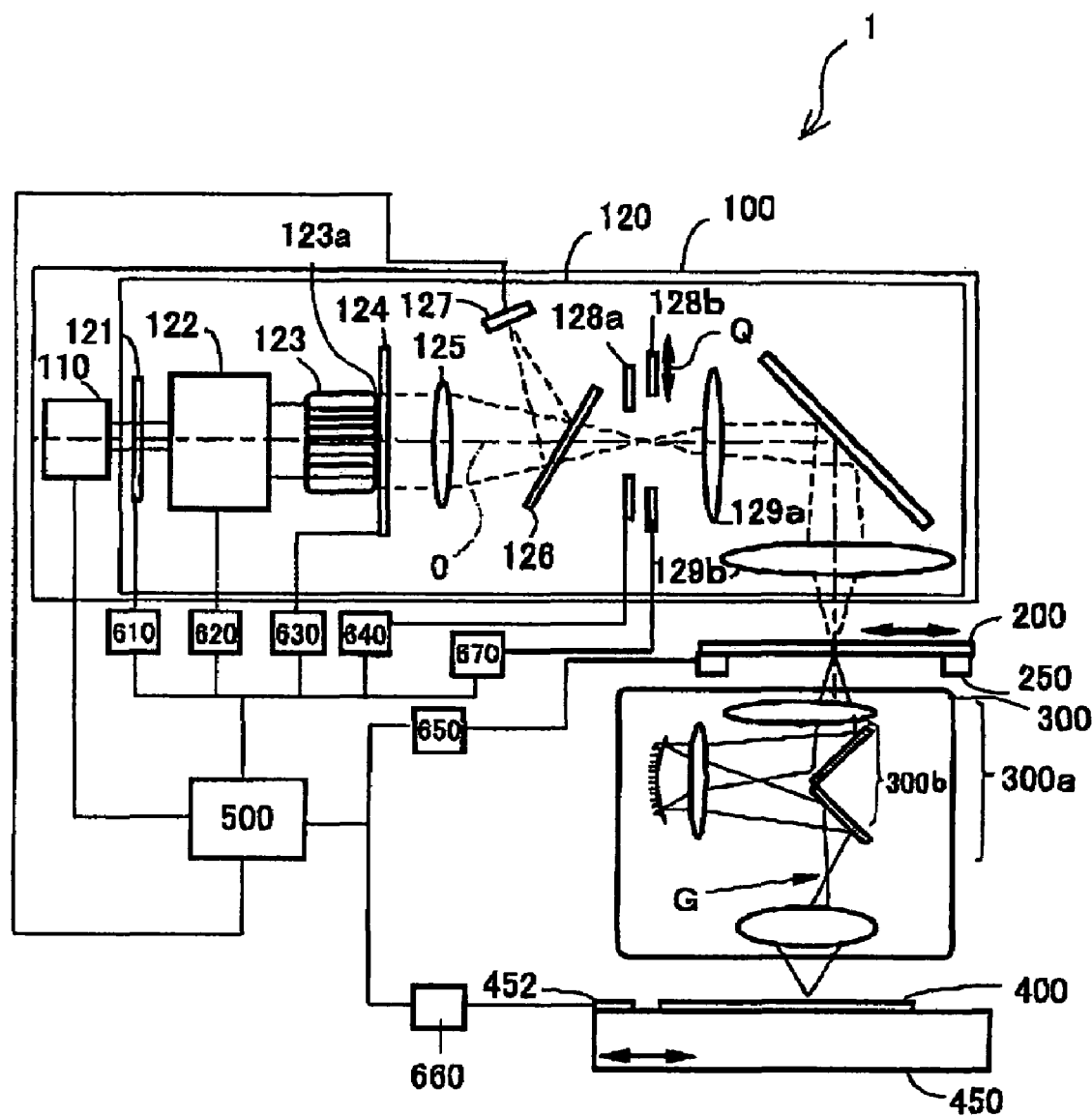
FIG. 1 is a schematic block diagram of an exposure apparatus of the first embodiment according to the present invention.

FIG. 1 is a schematic block diagram of an exposure apparatus 1 of the first embodiment according to the present invention. The exposure apparatus 1 includes an illumination unit (100) which illuminates a reticle (200) as an original form on which a circuit pattern as a pattern is formed, a projection optical system (300) which projects a diffracted light generated at the illuminated circuit pattern onto a plate (400) as a substrate, and a control unit (500).

The exposure apparatus 1 exposes the circuit pattern formed on the reticle 200 onto the plate 400 with a step-and-scan method, and is suitable for a lithography process with a resolution of a submicron, quarter-micron, or smaller.

The illumination unit 100 includes a light source (110) and an illumination optical system (120), and illuminates the reticle 200 on which the circuit pattern for transfer is formed. The light source 110 is for emitting the illumination light for exposure, and uses for example, a laser.

The light source 110 can use an ArF excimer laser with a wavelength of 193 nm, a KrF excimer laser with a wavelength of 248 nm, a F2 laser with wavelength of 157 nm, or the like. However, the laser is not limited to the excimer laser, and the number of the lasers used is not limited either. For example, use of two solid lasers respectively independent can reduce the speckle largely caused by coherence, because of no coherence between the solid lasers to each other.

The illumination optical system may swing linearly or rotationally to reduce the speckle. The light source 110 is not limited to the laser, and can use one or more lamps such as mercury or xenon lamps.

The illumination optical system 120 guides the illumination light from the light source 110 onto the reticle 200 as the original form to illuminate the reticle 200, and includes optical elements such as an optical integrator (123) arranged from the light source 110 to the reticle 200, a stop (124), a condensing lens (125), and a half mirror (126).

A darkening element (121) is formed, for example, by a plurality of light control filters (ND filters) that respectively have different transmittance. The ND filters are driven and combined by an ND drive unit (610) so as to optimize the exposure on the surface of the plate 400, and can adjust the coefficient of darkening in detail.

An optical system 122 for shaping beam includes a plurality of optical elements and a zoom lens, and is driven by a lens system drive unit (620) to control the intensity distribution and the angle distribution of the light bundle which is incident to the following optical integrator 123

The optical integrator 123 arranges a plurality of micro lenses in two-dimensions, and forms a secondary light source near its emitting surface 123a. A stop 124 is arranged near the emitting surface 123a of the optical integrator 123, and is variable in its aperture size and shape. A stop drive unit 630 can adjust the aperture size and shape of the stop 124.

The condensing lens 125 condenses the light bundle emitted from the plurality of the secondary light source formed near the emitting surface 123a of the optical integrator 123, and uniformly illuminates the surface of the running field stop 128b as an irradiated surface which is conjugate with the plate 400 by overlapping the illumination to the surface of the running field stop 128b.

The half mirror 126 reflects a part of the light bundle (for example, a few percentage points) emitted from the optical integrator 123 to guide the part of the light bundle to an integrated exposure detector (127). The integrated exposure detector 127 is an illuminometer for detecting the light amount at all times in exposing, is arranged at a position optically conjugate with the reticle 200 and the plate 400, and sends a signal corresponding to its output toward the control unit 500.

The running field stop (the field stop) 128b includes a plurality of movable shielding plates, and regulates the illumination area of the reticle 200's surface and the exposure area of the plate 400's surface by forming its aperture shape to be specific by a running field stop drive unit (670). Further, the running field stop 128b is arranged at a position conjugate with the plate 400, and scans along the arrow Q direction in synchronization with a reticle stage 250 and a plate stage 450. The variable stop 128a is arranged near the running field stop 128b to improve the uniformity of the illumination on the exposure surface after scanning exposure.

Figure 2:
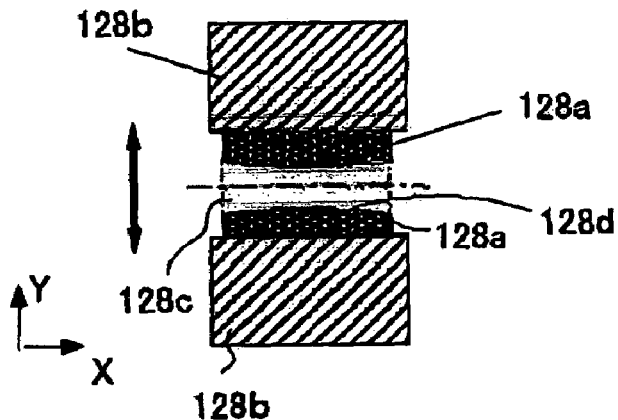
FIG. 2 is a partial sectional view showing positions of a variable stop and a running field stop used in the exposure apparatus shown in FIG. 1.

The variable stop 128a is arranged near a position conjugate with the plate 400, and arranged closer to the light source 110 than the conjugate position, i.e., arranged in the light path of the illumination light upper-stream position than the conjugate position. As shown in FIG. 2, the variable stop is formed so that an opening 128c that forms the exposure area (illumination area) becomes larger in accordance with the distance from the optical axis along the X-direction perpendicular to the scanning direction (Y-direction) in the plane which is perpendicular to the optical axis of the illumination light. The longer shaped side of the opening 128c can be adjusted in accordance with n-degree function. Here, n is an integer from 1 to 8. As explained before, the opening's 128c shape of the variable stop 128a is changeable, and the position of the variable stop 128a is adjustable backward and forward along the optical axis. The variable stop 128a is always closer to the light source than the position conjugate with the plate 400, while adjusting the position of the variable stop.

Imaging lenses 129a and 129b project the opening shape of the running field stop 128b onto the reticle's 200 surface as an irradiated surface, and illuminate the specific area on the reticle's 200 surface uniformly. The reticle 200 uses quartz for example, forms on its surface a circuit pattern or an image to be transferred, is supported by the reticle stage 250, and is driven by a reticle stage drive unit 650.

The illumination light from the reticle 200 comes onto the plate 400 via a projection optical system 300, and projects the circuit pattern on the reticle 200 onto the plate 400. The plate 400 is an object to be processed (a substrate) such as a wafer or a liquid crystal plate, and applies the photoresist on its surface. The reticle 200 is arranged substantially conjugate with the plate 400. The exposure apparatus 1 as a scanner that projects and exposes with step-and-scan method, transfers the circuit pattern on the reticle 200 onto the plate 400 by scanning the reticle 200 in synchronization with the plate 400. The exposure apparatus as a stepper of step-and-repeat type exposes while the reticle 200 and the plate 400 are stopping.

The projection optical system 300 is a catoptric optical system that includes a plurality of lenses (300a) and a plurality of mirrors (300b), and projects the circuit pattern on the reticle 200's surface onto the plate 400. The circuit pattern on the reticle 200's surface is projected with reduction onto the plate 400's surface after forming the image at an intermediate imaging position G in the projection optical system. The photoresist is applied on the surface of the plate 400.

A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate stage 450 supports the plate 400, and the structure of the plate stage 450 is omitted here because it is known in the art. For example, the plate stage 450 can move the plate 400 along the optical axis and in the plane perpendicular to the optical axis. A plate stage drive unit (660) controls the plate stage 450. The plate stage 450 is provided for example on a stage platen (not shown) supported on the floor via a dampener. The reticle stage 250 and the projection optical system 300 are provided, for example, on a mirror barrel platen, (not shown) supported on a base frame via a dampener, which is installed on the floor.

The reticle 200 and the plate 400 are scanned in synchronization. The position of the plate stage 450 and the position of the reticle stage 250 are observed for example by a laser interferometer etc., and the plate and the reticle are driven at a constant speed ratio. For example, in a condition where the reduction ratio of the projection optical system 300 is 1/A and the scanning speed of the plate stage 450 is B [mm/s], the scanning speed of the reticle stage 250 will be AB [mm/s]. And in this embodiment, the scanning directions of the reticle stage 250 and the plate stage 450 are opposite while they happen to be the same in accordance with the structure of the apparatus.

A light sensor (452) detects the light intensity (illumination) of the illumination light entering into the surface of the plate 400. The light sensor 452 is provided near the plate 400. The sensing part of the light sensor 452 is arranged at a position approximately corresponding to the surface of the plate 400, accepts the illumination light in the illumination area of the plate 400 in accordance with the drive of the plate stage 450, and the light sensor transmits the signal corresponding to the detected illumination to the control unit 500.

The control unit 500 drives the drive units 610 to 670 in accordance with the detected results of the integrated exposure detector 127 and the light sensor 452, and controls the exposure (i.e., the illumination distribution) on the surface of the plate 400.

Referring to FIGS. 3 to 7, now a description will be given of the method for improving-the uniformity of the illumination on the plate's 400 surface.

Figure 3:
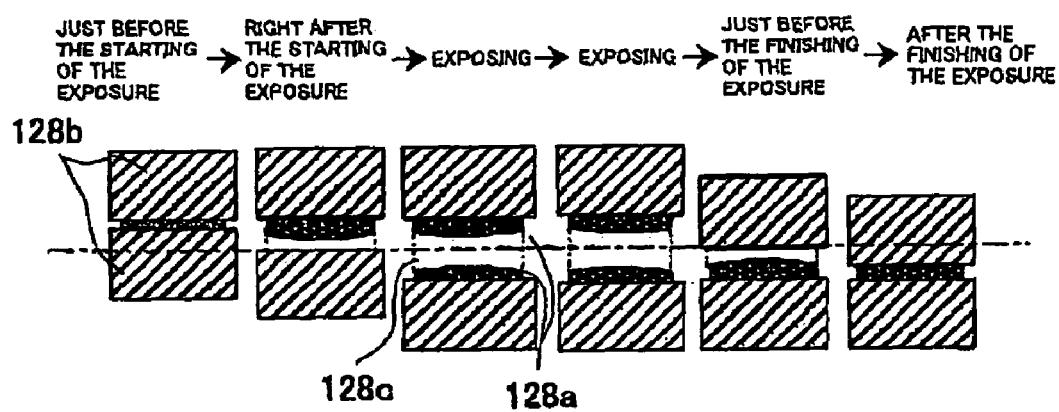
FIG. 3 shows a relation between an illumination area formed by the variable stop and an operating state of the running field stop in scanning and exposing with the exposure apparatus shown in FIG. 1.

FIG. 3 shows the changing state of the exposure area, or illumination area (i.e., the opening 128c) formed by the variable stop 128a and the relation between the illumination area and an operating state of the running field stop 128b in scanning and exposing with the exposure apparatus 1 according to this embodiment of the present invention. The exposure apparatus 1 secures the exposure area by scanning the reticle stage 250 and the plate stage 450 in synchronization with these motions, and does the projection exposure.

Figure 4:
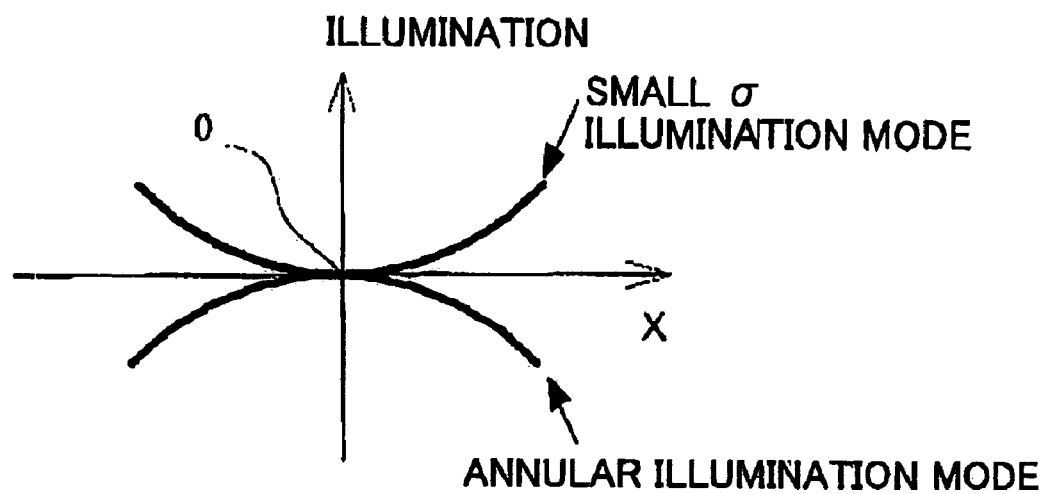
FIG. 4 shows an illumination distribution in the X-direction when an illumination mode is a small a mode and an annular mode.

FIG. 4 shows an illumination distribution in the X-direction (see also FIG. 2) when the illumination mode is the small σ mode and the annular mode. The illumination distribution in the X-direction varies and is uneven as shown in FIG. 4, because the incident angle of the light bundle to each optical element changes in accordance with the illumination mode. Therefore, the opening shape of the variable stop 128a should be adjusted as optimal in accordance with the illumination mode so that the illumination in the scanning exposure shows an appropriate distribution.

Figures 5A, 5B:
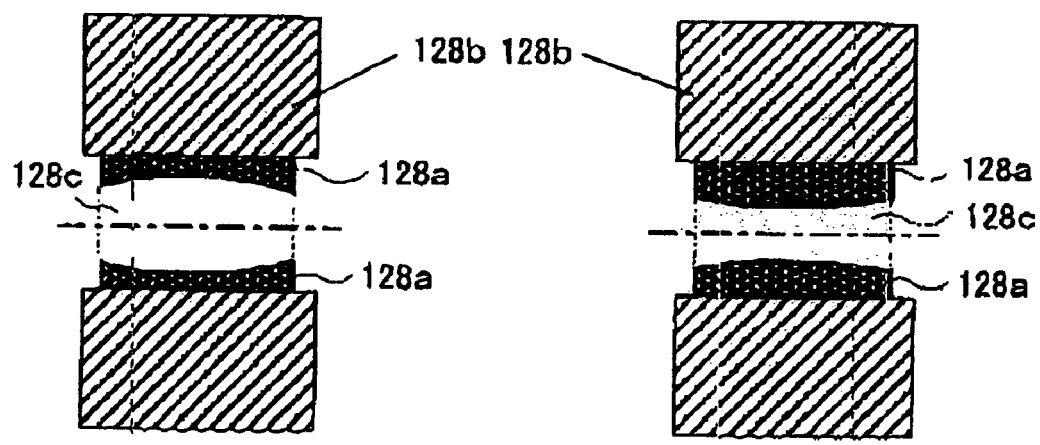
FIG. 5A is the small σ mode state.
FIG. 5B is the annular mode state.

For example, the illumination at the position distanced from the optical axis O is stronger than that on the optical axis O in the small σ mode, and the opening 128c of the variable stop is a barrel shape as shown in FIG. 5A, therefore, the illumination distribution in the scanning exposure is even in whole exposure area. The illumination at the position distanced from the optical axis O is weaker than that on the optical axis O in the annular mode, therefore, the opening 128c of the variable stop 128a is a pin cushion shape as shown in FIG. 5B so that the illumination distribution in scanning exposure is even in whole exposure area.

Figure 6A:
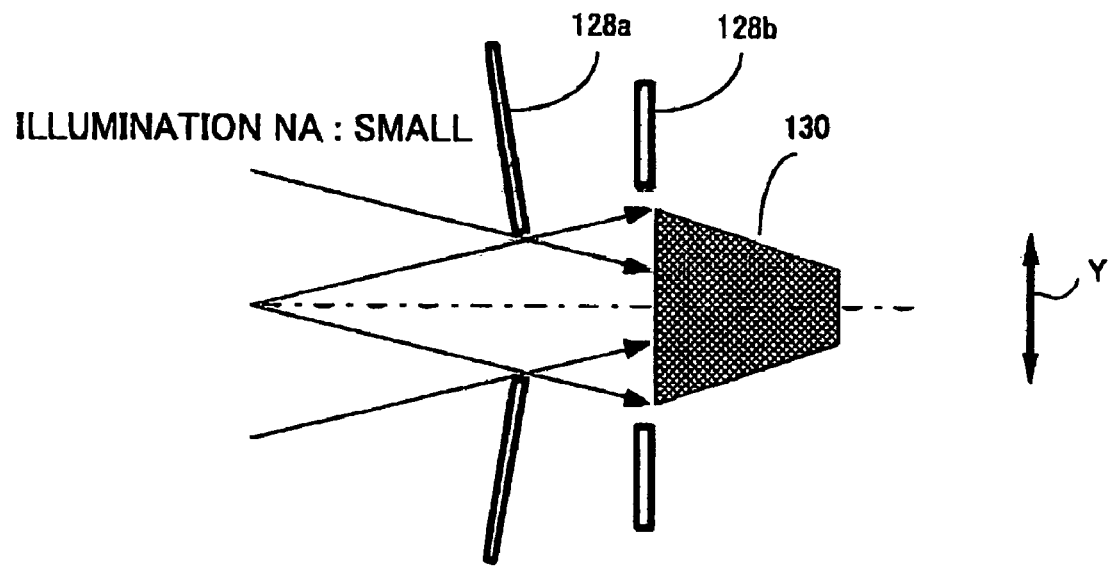
FIG. 6A is in condition of the illumination mode where the numerical aperture of the illumination optical system is small.

The variable stop 128a is arranged at a position defocused appropriately from the position conjugate with the surface of the plate 400. That is, the running field stop 128b is arranged at the position substantially conjugate with the surface of the plate 400, and the variable stop 128a is arranged closer to the light source 110 than the running field stop 128b. Accordingly as shown in FIG. 6A, the skirt part of the illumination distribution 130 in the Y-direction when both of the stages 250, 450 stop, is appropriately defocused so as to be trapezoid shape. Because in case of the scanning exposure in focused and rectangular distribution, the error of the integrated light intensity (the illumination distribution in scanning direction) becomes large by synchronization error of each stage: 250, 450, or output fluctuation of the light source 110, and the illumination can barely be maintained evenly. Here, it is called the distance between the position conjugate with the surface of the plate 400 and the position of the variable stop 128a along the optical axis O as "a defocus length".

Figure 6B:
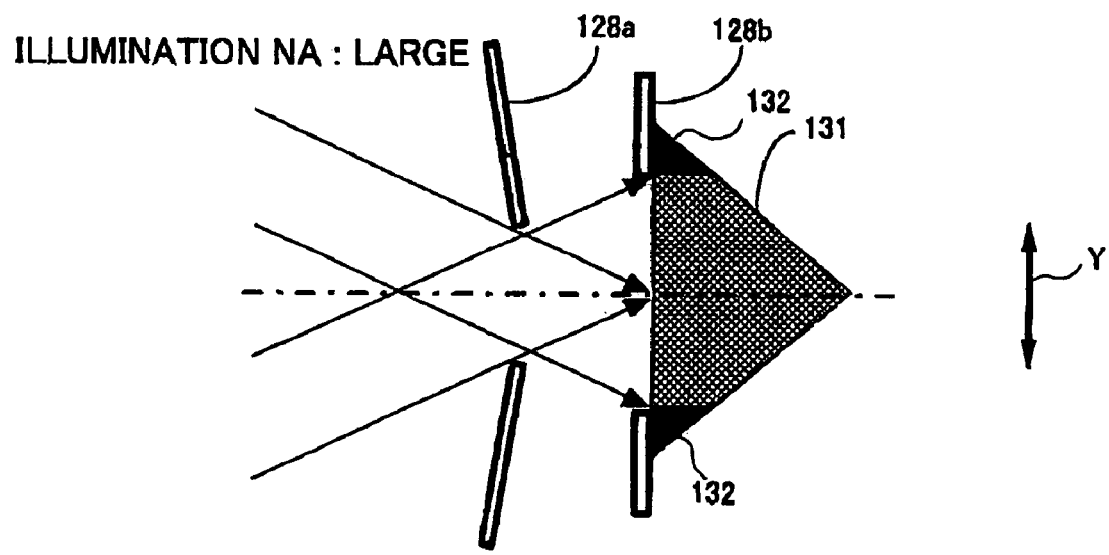
FIG. 6B is in condition of the illumination mode where the numerical aperture of the illumination optical system is large.

Change of the numerical aperture NA of the illumination optical system 120 while maintaining the defocus length of the variable stop 128a as a constant deforms the trapezoid shape of the illumination distribution 130 because of defocus change. Particularly, the larger the numerical aperture NA of the illumination optical system 120, the larger the defocus is as shown in FIG. 6B. As an edge 132 of the skirt of the illumination distribution 131 that is trapezoid-shaped that is eclipsed, the light intensity may be decreased and the evenness of the illumination distribution 131 in scanning direction (Y-direction) may deteriorate.

Figure 7:
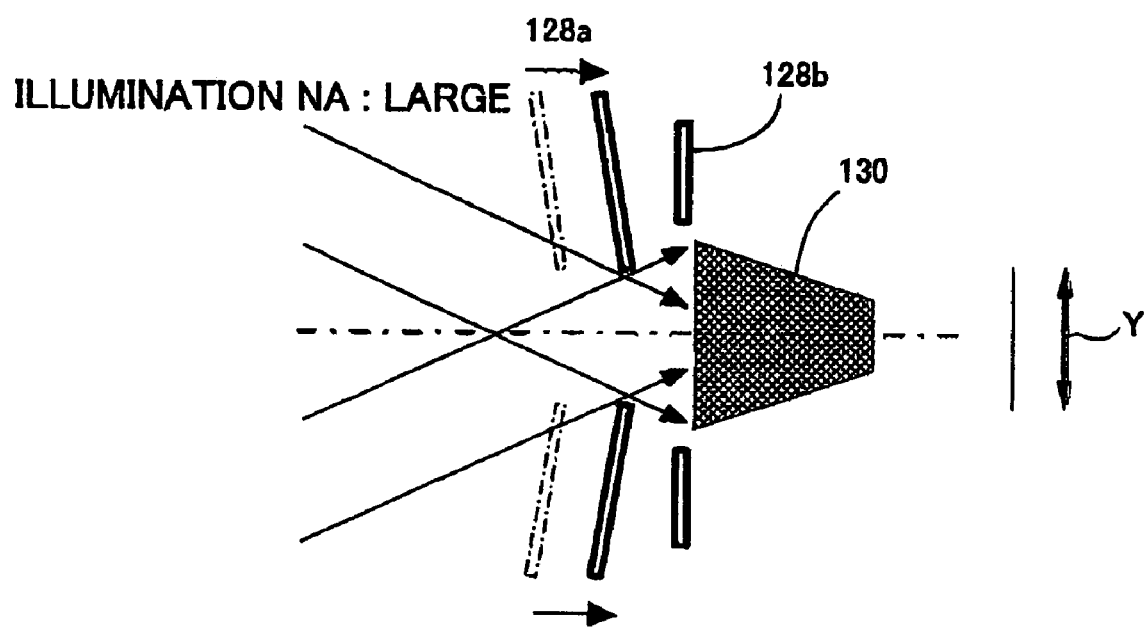
FIG. 7 shows a state of adjusting so that the defocus of the variable stop is small in the illumination mode where the numerical aperture of the illumination optical system is large.

Then, in the first embodiment of the present invention, the exposure apparatus has the variable stop 128a whose defocus length is variable, and has the mechanism for adjusting the position of the variable stop 128a along the optical axis in accordance with the illumination mode. As shown in FIG. 7, the position of the variable stop 128a is adjusted so that the defocus length of the variable stop 128a is closer to the position conjugate with the surface of the plate 400 in case the numerical aperture NA of the illumination optical system 120 is large. Therefore, the illumination distribution in the case of the illumination optical system 120 in large numerical aperture (NA) can be formed the same way as the illumination distribution 130 in the case of the illumination optical system 120 in small numerical aperture (NA) (see FIG. 6A) Thus, the illumination distribution in the Y-direction can be maintained as a constant by adjusting the defocus length of the variable stop 128a in accordance with the numerical aperture (NA) of the illumination optical system 120, despite the exposure conditions such as the illumination mode changes.

FIG. 8 is a flowchart explaining a method for improving the uniformity of illumination on the plate 400's surface in scanning exposure by the exposure apparatus 1 of the first embodiment according to the present invention. Before starting exposure, the optimum defocus length of the variable stop 128a is calculated and decided in accordance with the numerical aperture (NA) of the illumination optical system 120 in the plurality of the illumination mode (the small σ mode or the annular mode, etc.), and is stored in a specific storage means as adjustment data (Step 1). After that, the light sensor 452 is moved in the plane perpendicular to the optical axis two-dimensionally, and the illumination distribution of the exposure surface (i.e., the plate's 400 surface) in each illumination mode is detected. The illumination distribution of the exposure surface is detected by moving the light sensor 452 linearly in the case where the light sensor 452 is a line sensor. According to the detected results, the shape of the variable stop's 128a opening (128c) is calculated and decided so that the illumination distribution on the exposure surface will be specific (for example, an even distribution), and is stored in the specific storage means as adjustment data (Step 2). Generally, the illumination distribution is preferably even, however, the uneven illumination distribution can be decided in accordance with the transmittance of the reticle 200.

After selecting and deciding the illumination mode to be used and deciding the exposure on the surface of the plate 400 corresponding to the illumination mode, the scanning speed V [mm/s] of the plate stage 450, the width W [mm] of the variable stop 128*a* in scanning direction, and the laser emission frequency F [Hz] are respectively decided so as to satisfy the equation "V=F*W/n" explained before (Step 3). Next, the position and the opening's 128*c* shape of the variable stop 128*a* are adjusted by using the adjustment data corresponding to the selected illumination mode. That is, the variable stop drive unit 640 drives the variable stop 128*a* in accordance with the adjustment data of the opening's 128*c* shape and the defocus length, which correspond to the selected illumination mode and is one of the adjustment datum of the opening 128*c*'s shape and the defocus length calculated in advance and stored in the specific storage means (Step 4).

The reticle 200 on which the circuit pattern to be transferred is formed, is installed on the reticle stage 250 via the reticle chuck (Step 5), and the scanning exposure is started with the reticle 200 in synchronization with the plate 400 (Step 6). This exposure can maintain the trapezoid as the optimum illumination distribution and can form the illumination distribution in the scanning direction (Y-direction) to be specific (generally, even), despite the fact that the numerical aperture NA of the illumination optical system 120 has changed.

Still, both the defocus length and the opening's 128*c* shape of the variable stop 128*a* are adjusted in Step 4. However, in the case that the numerical aperture of the illumination system has a small change in the change of the illumination mode, Step 1 and the adjustment of the defocus length can be omitted. In the case that the illumination distribution on the exposure surface has a small change in the change of the illumination mode, Step 2 and the adjustment of the shape can be omitted.

[The Variation]

FIG. 9 is a flowchart for explaining a method for improving the uniformity of illumination on the plate 400's surface in scanning exposure by an exposure apparatus 1 of the variation according to the present invention. The same element explained in the first embodiment will be explained using the same reference numeral.

In the first embodiment as explained before, the optimum defocus length of the variable stop 128*a* is calculated and decided in accordance with the numerical aperture NA of the illumination optical system 120 in the plurality of the illumination mode (the small σ mode or the annular mode), and is stored in a specific storage means as adjustment data before starting exposure. However, in this variation, the light sensor 452 detects and measures the illumination distribution in the Y-direction (approximately trapezoidal distribution) in the plurality of the illumination mode (the small u mode or the annular mode). While stopping in advance, the optimum defocus length of the variable stop 128*a* is calculated and decided for making the trapezoidal distribution a specific distribution (for example, an even distribution) and the specific storage means stores the optimum defocus length of the variable stop 128*a* as adjustment data (Step 11).

After that, the light sensor 452 is moved in the plane perpendicular to the optical axis two-dimensionally, and the illumination distribution of the exposure surface (i.e., the plate 400's surface) in each illumination mode is detected. The illumination distribution of the exposure surface is detected by moving the light sensor 452 linearly if the light sensor 452 is a line sensor. According to the detected results, the shape of the variable stop's 128*a* opening (128*c*) is calculated and decided so that the illumination distribution on the exposure surface will be specific (for example, an even distribution), and is stored in the specific storage means as adjustment data (Step 12). Since steps 13 to 16 in this variation are the same as steps 3 to 6 in the first embodiment, the description will be omitted.

Still, the variable stop 128*a* is arranged near a position conjugate with the plate 400, and arranged closer to the light source 110 than the conjugate position. However, the variable stop 128*a* may be arranged closer to the plate 400 than the conjugate position so that the same effect is obtained in the case of arranging the variable stop 128*a* closer to the light source 110.

[The Second Embodiment]

Figure 10:
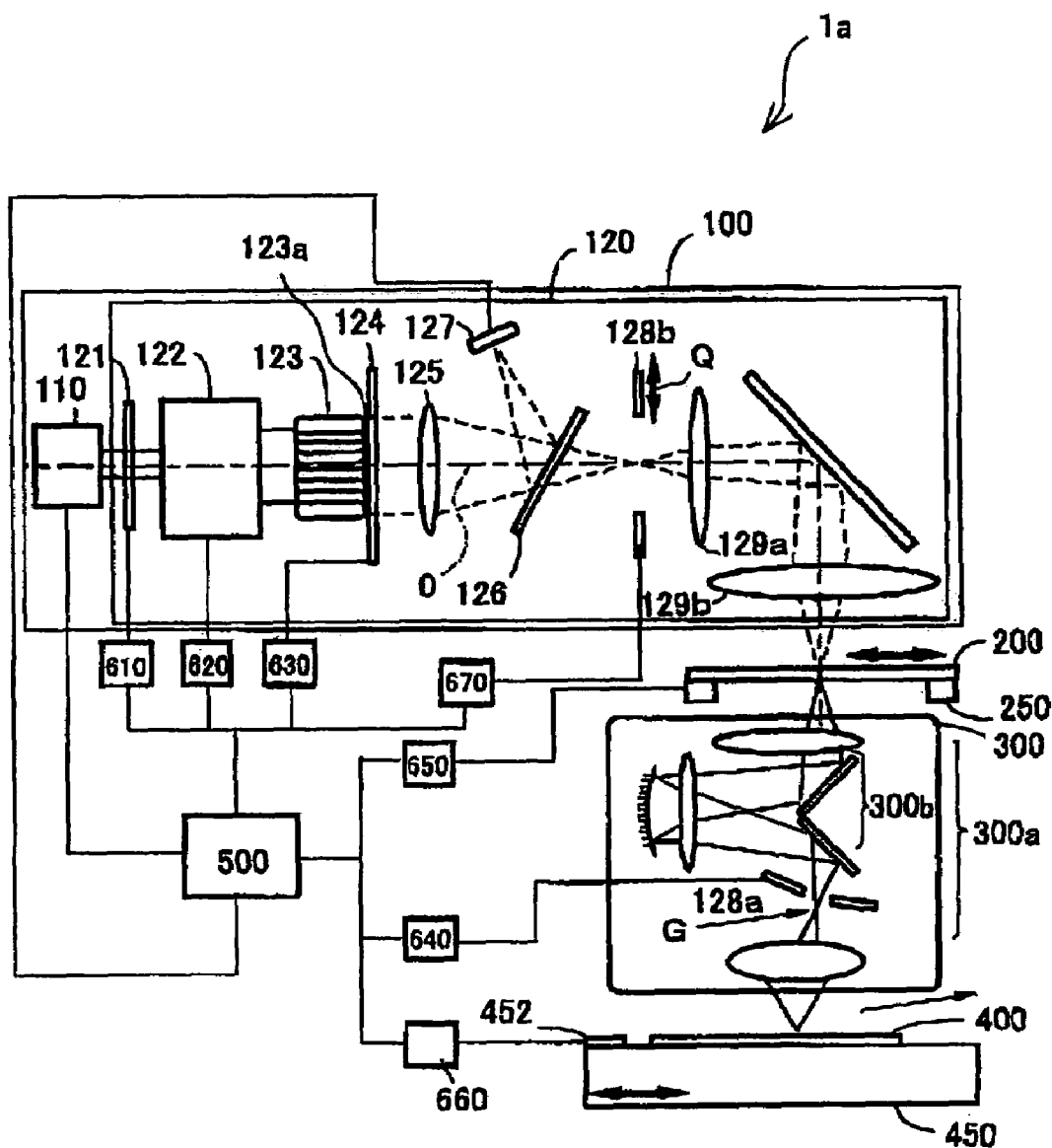
FIG. 10 is a schematic block diagram of an exposure apparatus of the second embodiment according to the present invention.

FIG. 10 is a schematic block diagram of the step-and-scan type exposure apparatus 1*a* of the second embodiment according to the present invention. The same element explained in the first embodiment uses the same reference numeral and the description will be omitted.

An intermediate image of the circuit pattern on the reticle 200 is formed at the intermediate imaging position G in the projection optical system 300, which is conjugate with the surface of the plate 400. The variable stop 128*a* is arranged closer to the light source 110 (i.e., upper stream in the light path of the illumination light) than the intermediate imaging position G. The second embodiment is the same as the first embodiment in a way such that the longer side of the opening 128*c* is along the direction perpendicular to the scanning direction in the plane perpendicular to the optical axis O near the variable stop 128*a*, and the longer side shape of the opening 128*c* can be adjusted in accordance with n-degree function. The second embodiment is also the same as the first embodiment at the point where the exposure apparatus has the mechanism for adjusting the defocus length from the intermediate imaging position G, and adjusts the position of the variable stop 128*a* which is driven along the optical axis of the projection optical system by the variable stop drive unit 640.

The structure explained before can decide the optimum illumination distribution in scanning exposure, despite the change of the illumination NA in accordance with the change of the exposure condition (the illumination mode). Particularly, a mechanical limitation is small near the intermediate imaging position G. There is a lot of space for arranging the elements, and the variable stop 128*a* can be sufficiently close to the intermediate imaging position G in the case of large illumination NA such as the large σ mode or the annular mode. In these cases, according to the illumination mode (a normal σ illumination mode, an annular mode, a quadrupole illumination mode, etc.), the illumination distribution is adjusted by deforming the variable stop 128*a* to the shape in accordance with optimum n-degree function.

Still, the variable stop 128*a* is arranged at the position near the intermediate imaging position G and closer to the light source 110. However, the variable stop 128*a* can be arranged at the position near the intermediate imaging position G and closer to the plate 400. Both can obtain the same effect.

[The Third Embodiment]

Figure 17:
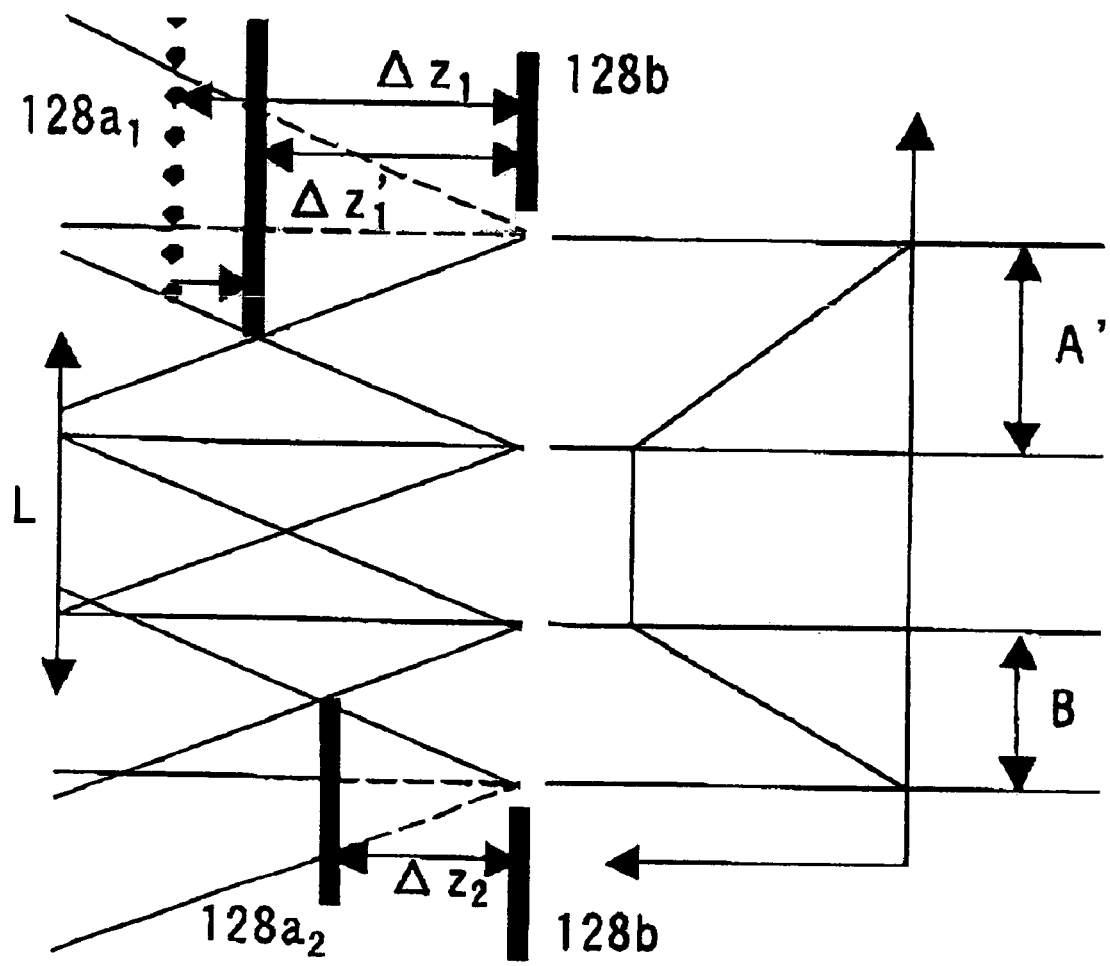
FIG. 17 is an explanatory view of the defocus distortion caused by a defocus difference of the variable stop.

FIG. 17 is a schematic view showing the relationship between the variable stop 128*a* and the running field stop 128*b* of the third embodiment according to the present invention. The variable stop 128*a* in this embodiment has a light shielding element (128*a*1) and a light shielding element (128*a*2) that is facing the light shielding element 128*a*1, arranging the opening between them, and can adjust the distance from each light shielding element to the running-field stop 128*b* along the optical axis. Any other structures are the same as the first and the second embodiments, therefore the description will be omitted. Although FIG. 17 shows the variable stop 128a is perpendicular to the optical axis, it may be tilted as shown in the other FIG. 128b shown in FIG. 17 becomes a conjugate image of the running field stop 128b in applying the third embodiment to the second embodiment. This embodiment measures the defocus distortion of the projection image, and adjusts the defocus difference from the running field stop 128b to the light shielding elements 128a1 and 128a2 so that the defocus distortion will be fine. In FIG. 17, by adjusting the defocus length between the upper light shielding element 128a and the running field stop 128b from Δz1 to Δz1', the distance between the light shielding element 128a1 and the running field stop 128b becomes different from the distance between the light shielding element 128a2 and the running field stop 128b, and the defocus distortion is adjusted.

The defocus distortion may be measured by judging the image exposed on the plate 400, or calculating the defocus distortion from the results of the illumination light intensity centroid measured by the light sensor 452 arranged on the stage. Generally, the defocus distortion is adjusted to be as small as possible. In the condition that the allowance of the image position shift caused by the defocus distortion is ΔT [nm] per 1 μm of defocusing, the difference of the defocus lengths Δz1 and Δz2 from the running field stop 128b to the facing two variable stops as (|ΔAz1−Δz2|) is adjusted so as to satisfy the equation of $\Delta T > NA2 \cdot \beta 2 \cdot (\Delta z1 - \Delta z2)/3L$. Here, L is the opening width of the variable stop, NA is the numerical aperture on the plate 400, β is magnification from the variable stop 128a to the surface of the plate 400.

However, in the case that generating a specific defocus distortion is preferable to improving Mix & Match to other exposure apparatus, the defocus difference may be adjusted so as to generate the defocus distortion.

Still, FIG. 17 shows an example that moves only the light shielding element 128a1 along the optical axis. However, the defocus difference from the running field stop 128b may be adjusted by moving both of the light shielding members 128a1 and 128a2.

FIG. 18 is a flowchart for explaining a method for minimizing the defocus distortion on the surface of the plate 400 in scanning exposure by the exposure apparatus 1 of the third embodiment according to the present invention. Before starting exposure, a test wafer is exposed in accordance with the numerical aperture (NA) of the illumination optical system 120 in the plurality of the illumination mode (the small a mode or the annular mode, etc.). Then, the optimum defocus difference of the variable stop 128a is decided and stored by measuring the defocus distortion (Step 1).

After selecting and deciding the illumination mode to be used and deciding the exposure on the surface of the plate 400 corresponding to the illumination mode, the scanning speed V [mm/s] of the plate stage 450, the width W [mm] of the variable stop 128a in scanning direction, and the laser emission frequency F [Hz] are respectively decided so as to satisfy the equation explained before (Step 2). Following, the position and the opening's 128c shape of the variable stop 128a are adjusted by using the adjustment data corresponding to the selected illumination mode. That is, the variable stop drive unit 640 drives the variable stop 128a in accordance with the adjustment data of the opening 128c's shape and the defocus length, which correspond to the selected illumination mode and is a part of the adjustment data of the opening 128c's shape and the defocus length calculated in advance and stored in the specific storage means (Step 3).

The reticle 200 on which the circuit pattern to be transferred is formed, is installed on the reticle stage 250 via the reticle chuck (Step 4), and the scanning exposure is started with the reticle 200 in synchronization with the plate 400 (Step 5). This exposure can minimize the defocus distortion despite of the fact that the numerical aperture (NA) of the illumination optical system 120 has changed by the change of the illumination mode. Though this flowchart shows only the minimization of the defocus distortion, it may combine with the first and the second embodiments.

Figure 11:
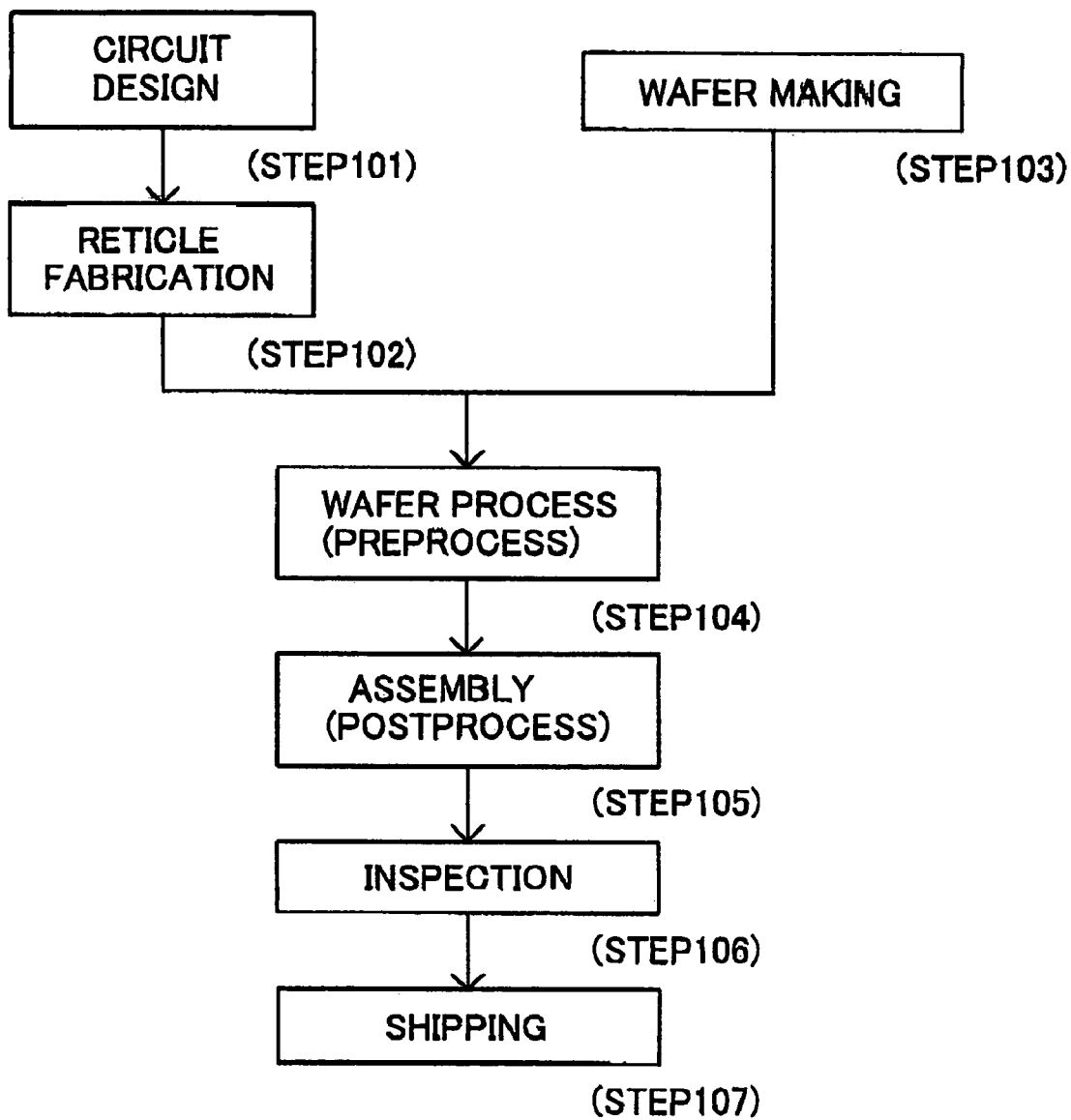
FIG. 11 is a flowchart for explaining a method for fabricating devices, which has an exposure process by the exposure apparatus shown in FIG. 1.
Figure 12:
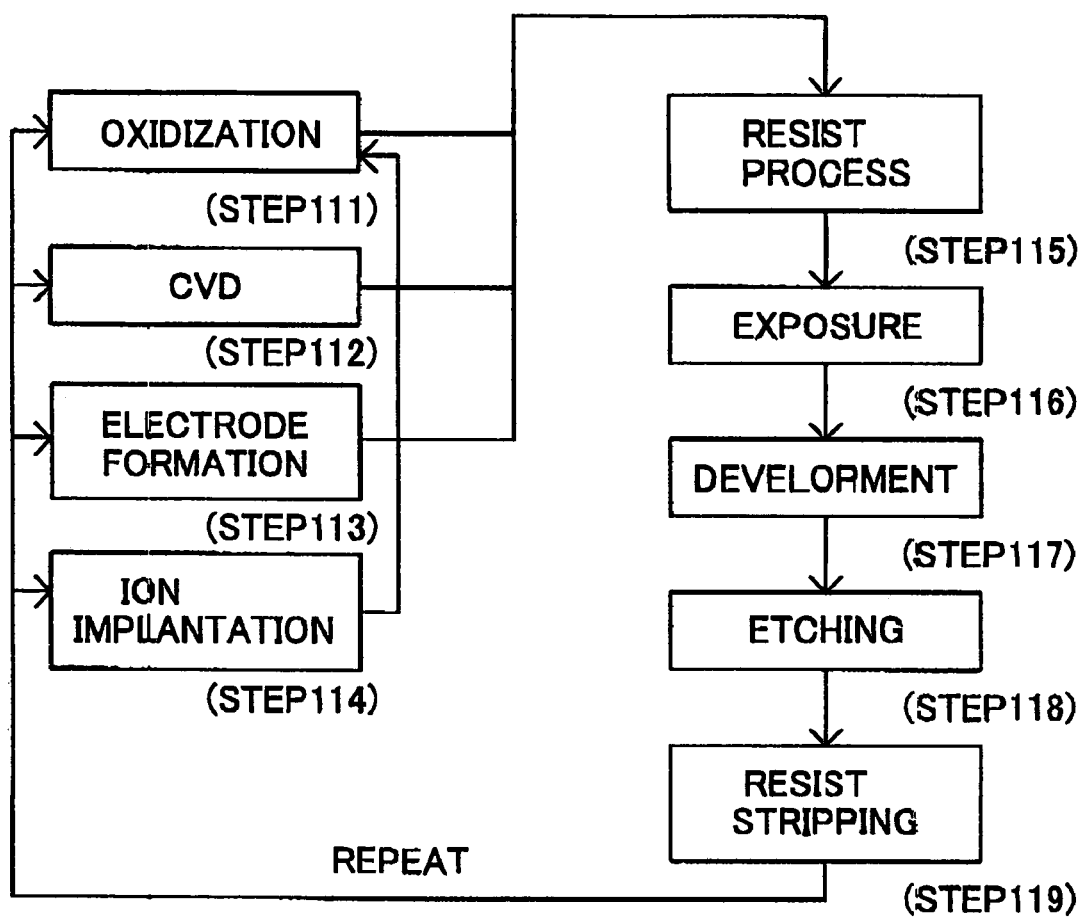
FIG. 12 is a detailed flowchart of the step 104 shown in FIG. 11.
Figure 13:
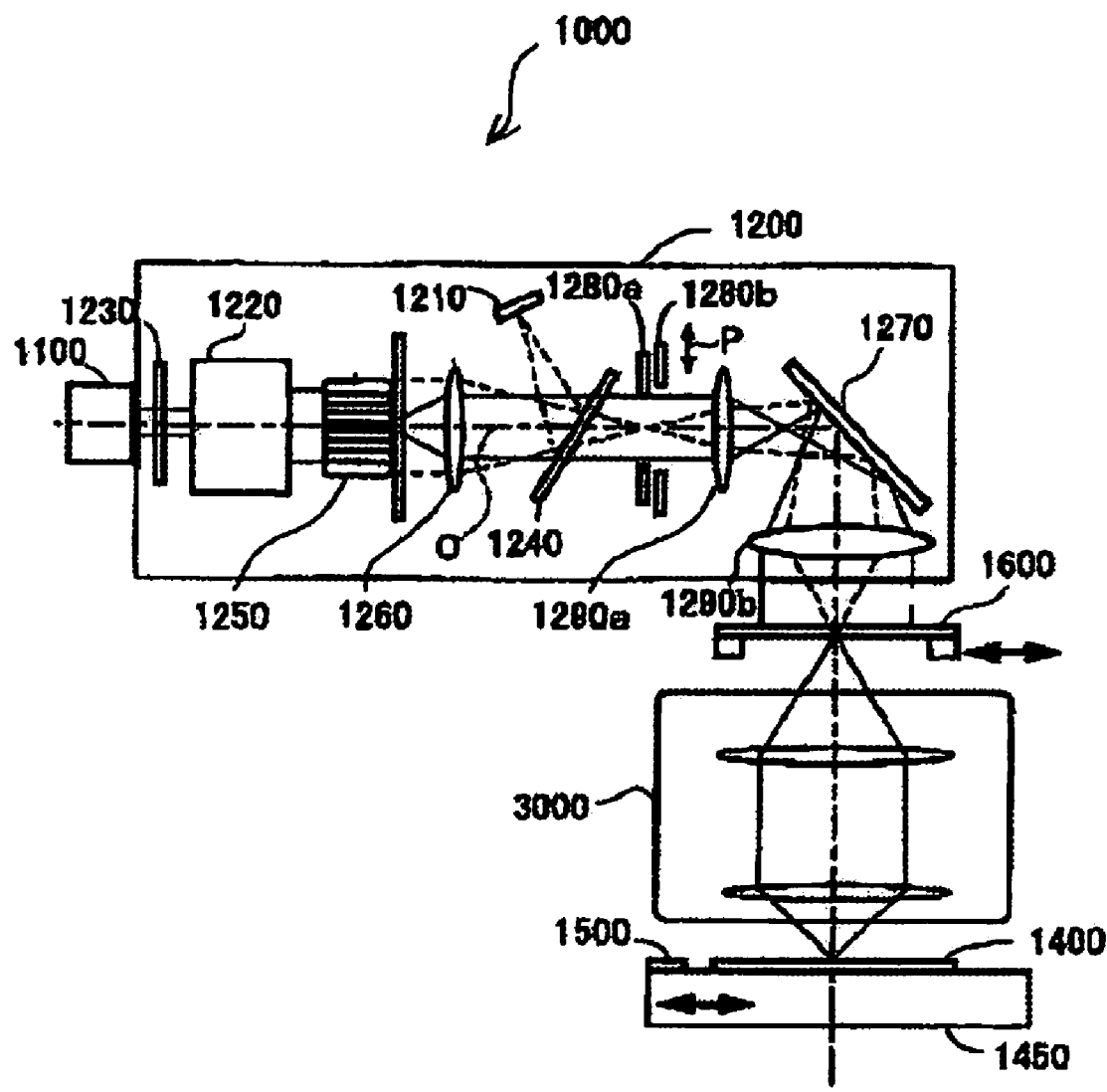
FIG. 13 is a schematic block diagram of a conventional step-and-scan type exposure apparatus.
Figure 14:
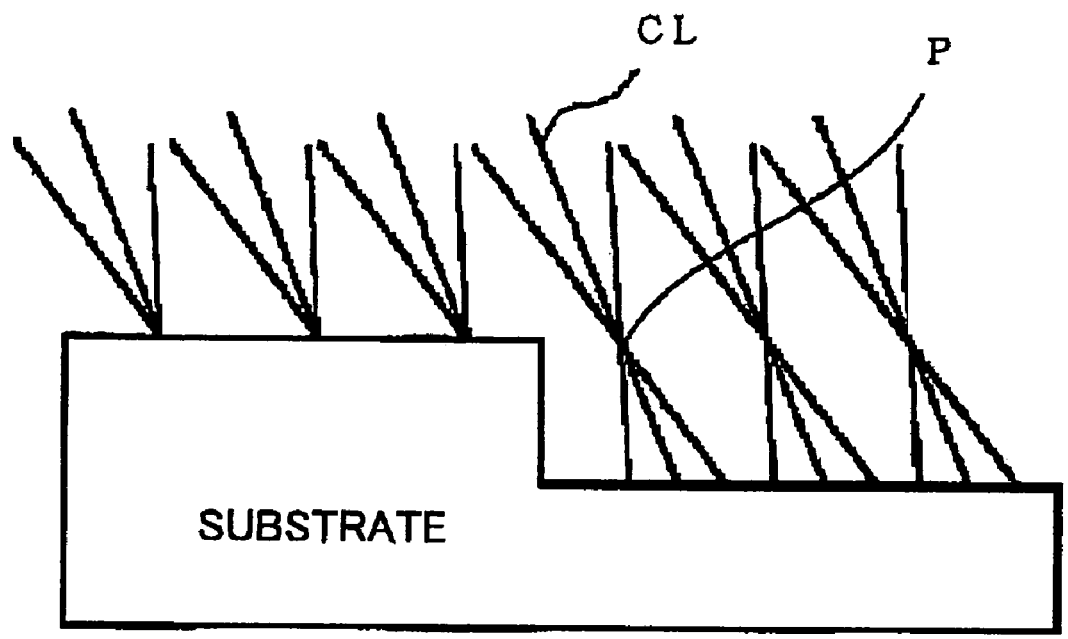
FIG. 14 is an explanatory view of a defocus distortion.
Figure 15A:
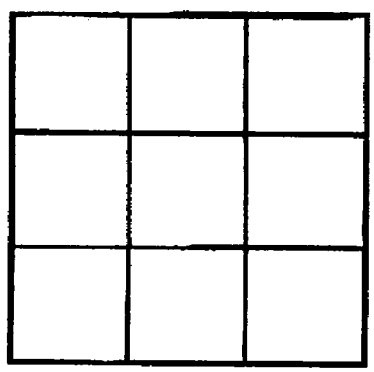
FIG. 15A is a front view of a grid pattern.
Figure 15B:
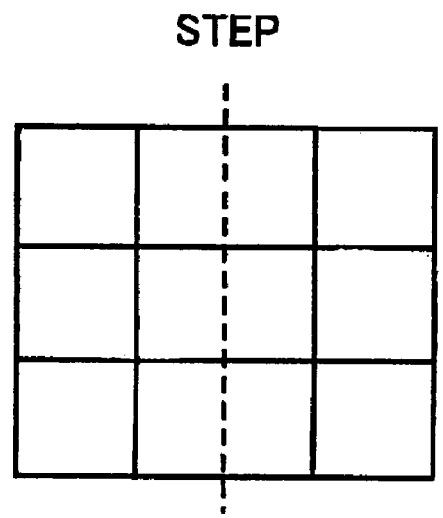
FIG. 15B shows a transferred image of the grid pattern shown in FIG. 15A when the defocus distortion is produced.
Figure 16:
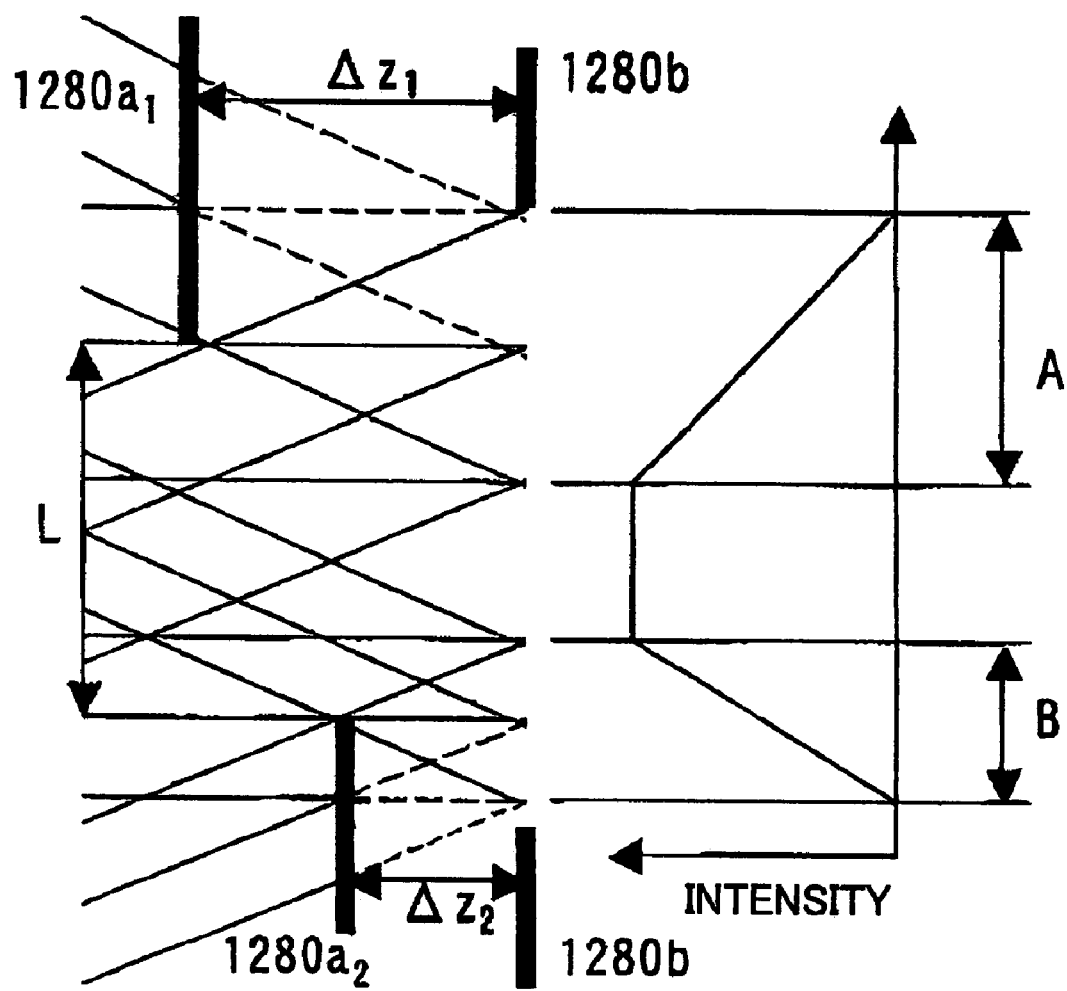
FIG. 16 is an enlarged schematic view of a light beam near the variable stop in the exposure apparatus shown in FIG. 13.

Referring now to FIGS. 11 and 12, a description will be given of an embodiment of a device fabricating method using the above exposure apparatus. FIG. 11 is a flowchart for explaining the fabrication of devices (i.e., semiconductor chips such as IC and LSI, LCDs, CCDs, etc.). Here, as an example, a description will be given of a semiconductor chip fabrication. Step 101 (circuit design) designs a semiconductor device circuit. Step 102 (mask fabrication) forms a mask having a designed circuit pattern. Step 103 (wafer preparation) manufactures a wafer using materials such as silicon. Step 104 (wafer process), referred to as a pretreatment, uses the mask and wafer to form the actual circuitry on the wafer through photolithography. Step 105 (assembly), also referred to as a posttreatment, forms the wafer from Step 104 into a semiconductor chip and includes an assembly step (e.g., dicing, bonding), a packaging step (chip sealing) and the like. Step 106 (inspection) performs various tests on the semiconductor device made in Step 105, such as the validity and durability tests. Through these steps, a semiconductor device is finished and shipped (Step 107).

FIG. 12 is a detailed flowchart of the wafer process in Step 104. Step 111 (oxidation) oxidizes the wafer's surface. Step 112 (CVD) forms an insulating film on the wafer's surface. Step 113 (electrode formation) forms electrodes on the wafer by vapor disposition and the like. Step 114 (ion implantation) implants ion into the wafer. Step 115 (resist process) applies a photosensitive material onto the wafer. Step 116 (exposure) uses the exposure apparatus to expose a circuit pattern on the mask onto the wafer. Step 117 (development) develops the exposed wafer. Step 118 (etching) etches parts other than a developed resist image. Step 119 (resist stripping) removes unused resist after etching. These steps are repeated to form multilayer circuit patterns on the wafer. The device fabrication method of this embodiment may manufacture higher quality devices than the conventional method. Accordingly, the device fabricating method and the devices as products are also within the scope of the present invention.

Further, the present invention is not limited to these preferred embodiments, and various variations and modifications may be made without departing from the scope of the present invention.

Accordingly, the exposure apparatus according to the present invention can form the illumination distribution on the substrate to be desirable (for example, an even distribution) and can expose with high accuracy by adjusting the position and the opening shape of the variable stop, despite the fact that the condition of the exposure apparatus or the numerical aperture of the optical system has changed.

Particularly, in the case that the numerical aperture is large, the exposure apparatus can prevent the decrease of the illumination efficiency by reducing the eclipse of the stop by reducing the defocus length of the variable stop, and can form the even illumination distribution. By arranging the variable stop near the intermediate imaging position in the projection optical system, the exposure apparatus can have enough space to arrange and move the variable stop. That is, the exposure apparatus can reduce the defocus length sufficiently in the case of a large numerical aperture. Therefore, the exposure apparatus can expose a fine pattern, fabricate a high quality wafer, and improve available percentages of the device fabrication.

What is claimed is:

1. An exposure apparatus comprising:
an illumination optical system for illuminating an reticle using light from a light source,
a projection optical system for projecting a pattern of the reticle onto a substrate; and
a variable stop having an opening for regulating an illumination area on the substrate, said variable stop is arranged near a position conjugate with the substrate,
wherein a position of the variable stop is variable along an optical axis of the illumination optical system or an optical axis of the projection optical system, and adjustable in accordance with a numerical aperture of the light illuminating the reticle.

2. The exposure apparatus according to claim 1, wherein the variable stop is arranged at a position closer to the light source than the position conjugate with the substrate.

3. The exposure apparatus according to claim 1, wherein the variable stop is arranged at a position closer to the substrate than the position conjugate with the substrate.

4. The exposure apparatus according to claim 1, wherein shape of the opening of the variable stop is variable.

5. The exposure apparatus according to claim 1, wherein the variable stop is adjusted so that the distance between the variable stop and the position conjugate with the substrate when the numerical aperture is the first value is longer than the distance between the variable stop and the position conjugate with the substrate when the numerical aperture is the second value that is larger than the first value.

6. The exposure apparatus according to claim 1, wherein the position of the variable stop along the optical axis is adjusted so that the light from the light source has a specific illumination distribution on the substrate.

7. The exposure apparatus according to claim 1, wherein the substrate is exposed by scanning using the light from the light source, and the position of the variable stop along the optical axis is decided so that an illumination distribution of the illumination area along the scanning direction is specific.

8. The exposure apparatus according to claim 1, wherein an adjustment value corresponding to an exposure condition that is selected from a plurality of exposure conditions is decided in accordance with data which indicates the adjustment value for the position of the variable stop along the optical axis, said data is corresponding to the numerical aperture of the light illuminating the reticle in the plurality of the exposure conditions, and the position of the variable stop along the optical axis is adjusted.

9. The exposure apparatus according to claim 1, further comprising a field stop at the position substantially conjugate with the substrate.

10. The exposure apparatus according to claim 1, wherein the projection optical system forms an intermediate image of the pattern at the position substantially conjugate with the substrate, and the variable stop is arranged near a position where the intermediate image is formed at a closer side to the light source.

11. An exposure apparatus comprising:
an illumination optical system for illuminating an reticle using light from a light source,
a projection optical system for projecting a pattern of the reticle onto a substrate; and
a variable stop having an opening for regulating an illumination area on the substrate, said variable stop is arranged near a position conjugate with the substrate,
wherein the variable stop has the first light shielding element and the second light shielding element,
wherein a relative position between the first light shielding element and the second light shielding element is variable along an optical axis of the illumination optical system or an optical axis of the projection optical system.

12. An illumination optical system for illuminating an irradiated surface using light from a light source comprising a variable stop having an opening for regulating an illumination area on the irradiated surface, said variable stop is arranged near a position conjugate with the irradiated surface,
wherein a position of the variable stop is variable along an optical axis of the illumination optical system, and adjustable in accordance with a numerical aperture of the light illuminating the reticle.

13. An illumination optical system for illuminating an irradiated surface using light from a light source comprising a variable stop having an opening for regulating an illumination area on the irradiated surface, said variable stop is arranged near a position conjugate with the irradiated surface,
wherein the variable stop includes a first light shielding element and a second light shielding element, and a relative position of the first light shielding element and the second light shielding element is variable along an optical axis of the illumination optical system.

14. A device fabricating method comprising the steps of:
exposing a substrate by using an exposure apparatus including an illumination optical system for illuminating an reticle using light from a light source, a projection optical system for projecting a pattern of the reticle onto a substrate, and a variable stop having an opening for regulating an illumination area on the substrate, said variable stop is arranged near a position conjugate with the substrate, wherein a position of the variable stop is variable along an optical axis of the illumination optical system, or an optical axis of the projection optical system and adjustable in accordance with a numerical aperture of the light illuminating the reticle; and
developing the substrate that has been exposed.

15. A device fabricating method comprising the steps of:
exposing a substrate by using an exposure apparatus which comprises an illumination optical system for illuminating an reticle using light from a light source, a projection optical system for projecting a pattern of the reticle onto a substrate, and a variable stop having an opening for regulating an illumination area on the substrate, said variable stop is arranged near a position conjugate with the substrate, wherein the variable stop has the first light shielding element and the second light shielding element, wherein a relative position between the first light shielding element and the second light shielding element is variable along an optical axis of the illumination optical system or an optical axis of the projection optical system; and
developing the substrate that has been exposed.

* * * * *